(12) United States Patent
Srinivasan et al.

(10) Patent No.: US 6,851,095 B1
(45) Date of Patent: Feb. 1, 2005

(54) METHOD OF INCREMENTAL RECHARACTERIZATION TO ESTIMATE PERFORMANCE OF INTEGRATED DISIGNS

(75) Inventors: Arvind Srinivasan, San Jose, CA (US); Haroon Chaudhri, Berkeley, CA (US)

(73) Assignee: Magma Design Automation, Inc., Santa Clara, CA (US)

( * ) Notice: Subject to any disclaimer, the term of this patent is extended or adjusted under 35 U.S.C. 154(b) by 132 days.

(21) Appl. No.: 09/999,222

(22) Filed: Nov. 24, 2001

Related U.S. Application Data

(62) Division of application No. 09/357,940, filed on Jul. 21, 1999, now Pat. No. 6,499,129.
(60) Provisional application No. 60/093,830, filed on Jul. 22, 1998.

(51) Int. Cl.$^7$ ............................................... G06F 17/50
(52) U.S. Cl. ................................. 716/4; 716/7; 703/13
(58) Field of Search ................................. 716/1–11, 18; 703/13–15, 19

(56) References Cited

U.S. PATENT DOCUMENTS

| | | | |
|---|---|---|---|
| 5,305,229 A | | 4/1994 | Dhar |
| 5,331,568 A | * | 7/1994 | Pixley ............................ 716/3 |
| 5,416,721 A | | 5/1995 | Nishiyama et al. |
| 5,440,720 A | * | 8/1995 | Baisuck et al. ................ 703/2 |
| 5,533,148 A | * | 7/1996 | Sayah et al. ................ 382/240 |
| 5,553,008 A | | 9/1996 | Huang et al. |
| 5,640,328 A | | 6/1997 | Lam |
| 5,757,655 A | * | 5/1998 | Shih et al. ....................... 716/2 |
| 6,058,256 A | * | 5/2000 | Mellen et al. ................ 713/12 |
| 6,138,266 A | | 10/2000 | Ganesan et al. |
| 6,249,898 B1 | | 6/2001 | Koh et al. |

OTHER PUBLICATIONS

Bryant, R.E., "Algorithmic Aspects of Symbolic Switch Network Analysis," IEEE Trans. Computer–Aided Design, vol. CAD–6, No. 4, Jul. 1987, pp. 618–633.

Bryant, R.E., "Graph–Based Algorithms for Boolean Function Manipulation," IEEE Trans. Comput., vol. C–35, Aug. 1986, pp. 677–691.

Appenzeller, David P. et al., "Formal Verification of a PowerPC™ Microprocessor," Report RC (19971), IBM T.J. Watson Research Center, Yorktown Heights, NY 10598, Mar. 1995, pp. 1–6.

* cited by examiner

Primary Examiner—Leigh M. Garbowski
(74) Attorney, Agent, or Firm—Townsend and Townsend and Crew LLP

(57) ABSTRACT

A technique to verify, evaluate, and estimate the performance of an integrated circuit is embodied in a computer software program that is executable by a computer system. The technique accurately estimates of the performance (e.g., transient delays) of an integrated circuit, and has fast execution times. The technique includes an incremental recharacterization feature where only portions of the design which have been changed or are new or different will need to be recharacterized during subsequent runs of the software. Portions of the design which are the same need not be recharacterized, and results for those portions from a previous run (stored in a database) are used. This saves execution time since the performance recharacterization or evaluation process is generally more time consuming than a database look up. The technique is applicable to small circuits having relatively few transistors, and especially well suited for integrated circuits having millions of transistors and components. The technique handles the effects of deep-submicron integrated circuit technology.

25 Claims, 14 Drawing Sheets

METHOD OF INCREMENTAL RECHARACTERIZATION TO ESTIMATE PERFORMANCE OF INTEGRATED DISIGNS

CROSS-REFERENCES TO RELATED APPLICATIONS

This application is a division of U.S. patent application Ser. No. 09/357,940, filed Jul. 21, 1999, now U.S. Pat. No. 6,499,129 issued Dec. 24, 2002, which claims the benefit of U.S. provisional patent application Ser. No. 60/093,830, filed Jul. 22, 1998. The above applications, in their entirety as filed, and all the references cited in this application are incorporated by reference.

BACKGROUND OF THE INVENTION

The present invention relates to the field of electronic design automation (EDA) software, and more specifically, to techniques of verifying, evaluating, and estimating the performance of integrated circuits.

Integrated circuit technology is a marvel of the modem age. Integrated circuits are used in many applications such as computers, consumer electronics, networking, and telecommunications. There are many types of integrated circuits including microprocessors, microcontrollers, application specific integrated circuits (ASICs), gate arrays, programmable logic devices (PLDs), field programmable gate arrays (FPGAs), dynamic random access memories (DRAMs), static random access memories (SRAMs), erasable programmable read only memories (EPROMs), electrically erasable programmable read only memories (EEPROMs), and Flash memories. Integrated circuits are also sometimes referred to as "chips."

Integrated circuit technology continues to rapidly advance. Automation tools are needed to simplify and expedite the task of designing an integrated circuit. It is important to be able to accurately predict or estimate the performance of an integrated circuit before the integrated circuit is fabricated. Techniques are needed to provide accurate, fast estimates of the performance of an integrated circuit.

As semiconductor processing techniques continue to improve, the performance of integrated circuits also continues to improve. Deep-submicron integrated circuit technology has enabled commercial multimillion transistor commercial integrated circuits operating at, for example, 500 megahertz. High clock frequencies require the ability to reliably analyze the performance of circuits with little tolerance for error. A 10 percent tolerance in a performance estimate of a 500 megahertz design equates to a margin of 200 picoseconds, which is 0.200 nanoseconds. In other words, there is little room for error in performance estimation.

In addition to accuracy, capacity, and speed are also important considerations for any performance estimation technique. For example, time-to-market pressures demand performance analysis tools with the ability to obtain an accurate snapshot of the performance of a 10-million-transistor design within a day so that system architects can make meaningful architectural tradeoffs without having to wait for days to obtain an accurate result.

As can be seen, techniques are needed to predict and estimate the performance of integrated circuits, especially fast and efficient techniques that provide accurate results for integrated circuit designs with a large number of transistors.

SUMMARY OF THE INVENTION

The present invention provides a technique for the performance verification, evaluation, and estimation of integrated circuits. In an embodiment, the technique of the present invention is embodied in a computer software program that is to be executed by a computer system. In particular, the technique facilitates accurate estimates of the performance (e.g., transient delays) of an integrated circuit and has fast execution times. Although applicable to small circuits having relatively few transistors, the technique is especially suited for integrated circuits having millions of transistors and components.

The technology of the present invention is broadly applicable to custom, semicustom, and high-performance integrated circuits. The present invention may be used to accurately estimate the performance of all the paths of an integrated circuit. When used in designs operating in the 250 megahertz to 1 gigahertz range, and greater, the software of present invention can provide results within a design tolerance of about two percent.

Further, the present invention handles the complexities of integrated circuit technology, including deep-submicron effects. To achieve such tight tolerances, the performance estimation technique handles the deep-submicron effects of RC-interconnect and transistor interaction, cross-coupling capacitance, simultaneous-switching, and waveform shape. These effects are dynamic in nature and traditional techniques of static transistor-level path analysis or library-based approaches cannot incorporate these dynamic effects. The present invention provides significantly more accurate performance estimates for deep-submicron designs compared to other techniques such as static path analysis.

Since the present invention uses a dynamic simulation approach, it is able to incorporate cross-coupling capacitance, simultaneous-switching, and waveform shape effects with results that are comparable to Spice-level simulation. The present invention also produces fewer false paths with resulting savings in designer time and effort. A divide-and-conquer approach enables the present invention to deal with very large designs, with turnaround times of under a day for 10-million-transistor designs.

In an embodiment of the present invention, the performance of an integrated circuit is estimated by partitioning a netlist into strongly coupled components (SCCs). A plurality of vectors is generated for each of the strongly coupled components. Strongly driven nodes are determined for each SCC. Vector pairs are sequenced and accurate simulation is performed on each strongly coupled component. The result is an accurate estimate of the performance of the integrated circuit, covering all the paths. Moreover, strongly coupled components and the simulation results obtained during a first execution of software of the present invention are saved in a database. During subsequent executions, these saved strongly coupled components and the simulation results are reused for those strongly coupled components that are unchanged, saving considerable time.

Other aspects of the present invention include tighter integration between timing analysis and characterization by including Boolean information and automatic elimination of global (block-level) false paths.

In an embodiment, the invention is a method of evaluating the performance of an integrated circuit. A netlist or circuit description is partitioned into strongly coupled components. A number of vectors is generated for the strongly coupled components. The strongly driven nodes are determined. Stimulus is generated for the strongly coupled components. A strongly coupled component includes a first channel-connected component and a second channel-connected component. The first channel-connected component influences a Boolean output of the second channel-connected component, and the second channel-connected component influences a Boolean output of the first channel connected component. A strongly driven node includes a logical element driving the node with a drive strength greater than another logical element driving the same node.

In another embodiment, the invention is a computer program product including a computer usable medium with computer readable code for causing an evaluation of the performance of an integrated circuit. The computer program product includes computer readable code devices configured to cause a computer to effect partitioning a netlist into strongly coupled components; computer readable code devices configured to cause a computer to effect generating a plurality of vectors for the strongly coupled components; and computer readable code devices configured to cause a computer to effect determining strongly driven nodes.

The invention is further a method of estimating the performance of an integrated circuit design including selecting a circuit block of the integrated circuit design. The circuit block may be described in a Spice or netlist format. A logic function is obtained for a node of the circuit block. In a specific embodiment, the logic function includes four subfunctions f0, f1, f0', and f1'. Using the logic function, a set of vectors is determined that switch or transition the logic function at the node. A table is formed including the set of vectors.

In a further embodiment, the invention is a method of estimating the performance of an integrated circuit design including making a first estimation of the performance of the integrated circuit design. During the first estimation of the performance of the integrated circuit design, a database is created to store estimated performance results for the integrated circuit design. A second estimation of the performance of the integrated circuit design is made. During the second estimation of the performance of the integrated circuit design, the database is read. The stored estimated performance results from the database of at least a portion of the integrated circuit design are used, where the performance results for the portion of the integrated circuit design was estimated during the first estimation.

The invention includes a method of estimating the performance of an integrated circuit design including selecting a circuit block of the integrated circuit design. A logic function for a node of the circuit block is obtained. Using the logic function, a set of vectors is determined that will switch the logic function at the node. A table including the set of vectors is formed.

The invention includes a method of estimating the performance of an integrated circuit design including dividing the integrated circuit design into channel-connected components, where a channel-connected component includes nodes and transistors reachable by tracing source-drain connections of the transistors. Channel-connected components are identified that are connected in a feedback loop, where a feedback loop of channel-connected components includes an output of a first channel-connected component driving an input of a second channel-connected component and an output of the second channel-connected component driving an input of the first channel-connected component. Channel-connected components connected in a feedback loop are merged together to form first strongly coupled components.

Other objects, features, and advantages of the present invention will become apparent upon consideration of the following detailed description and the accompanying drawings, in which like reference designations represent like features throughout the figures.

DETAILED DESCRIPTION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Figure 1:
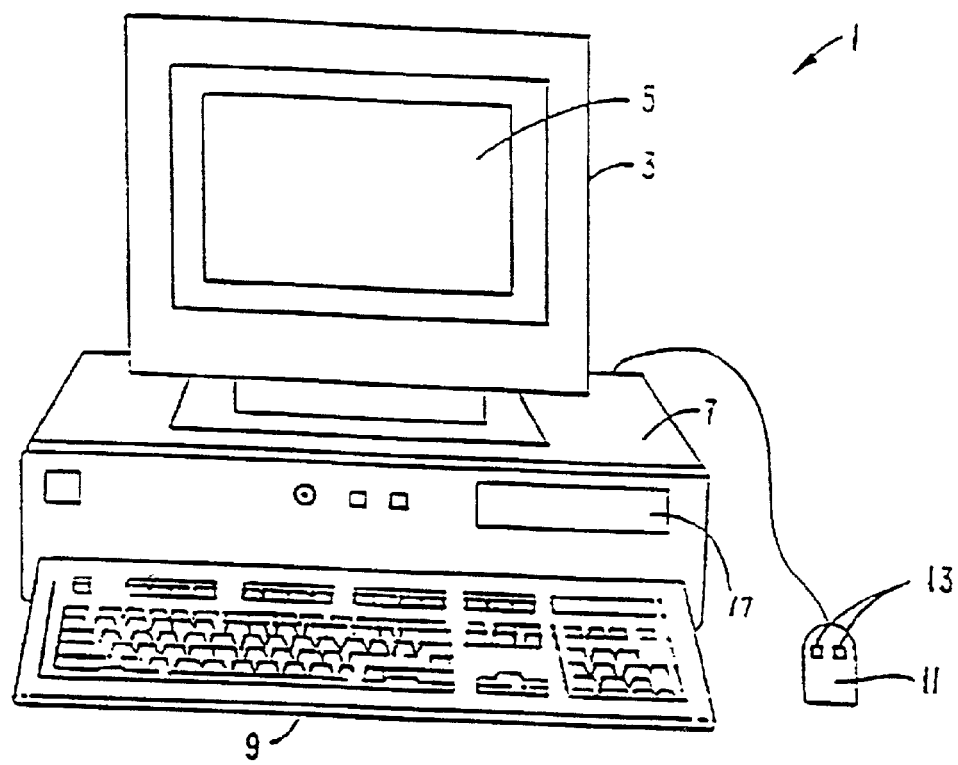
FIG. 1 shows a system of the present invention of estimating the performance of an integrated circuit.

FIG. 1 shows a system of the present invention for estimating the performance of an integrated circuit. FIG. 1 may comprise a computer or digital system used to execute the software of the present invention. For example, the method of the present invention may be performed using a computer workstation. FIG. 1 shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor, memory, mass storage devices 17, and the like. Mass storage devices 17 may include mass disk drives, floppy disks, Iomega® ZIP™ disks, magnetic disks, fixed disks, hard disks, CD-ROMs, recordable CDs, DVDs, tape storage, reader, and other similar media, and combinations of these. A binary, machine-executable version, of the software of the present invention may be stored or reside on mass storage devices 17. Furthermore, the source code of the software of the present invention may also be stored or reside on mass storage devices 17 (e.g., magnetic disk, tape, or CD-ROM).

Figure 2:
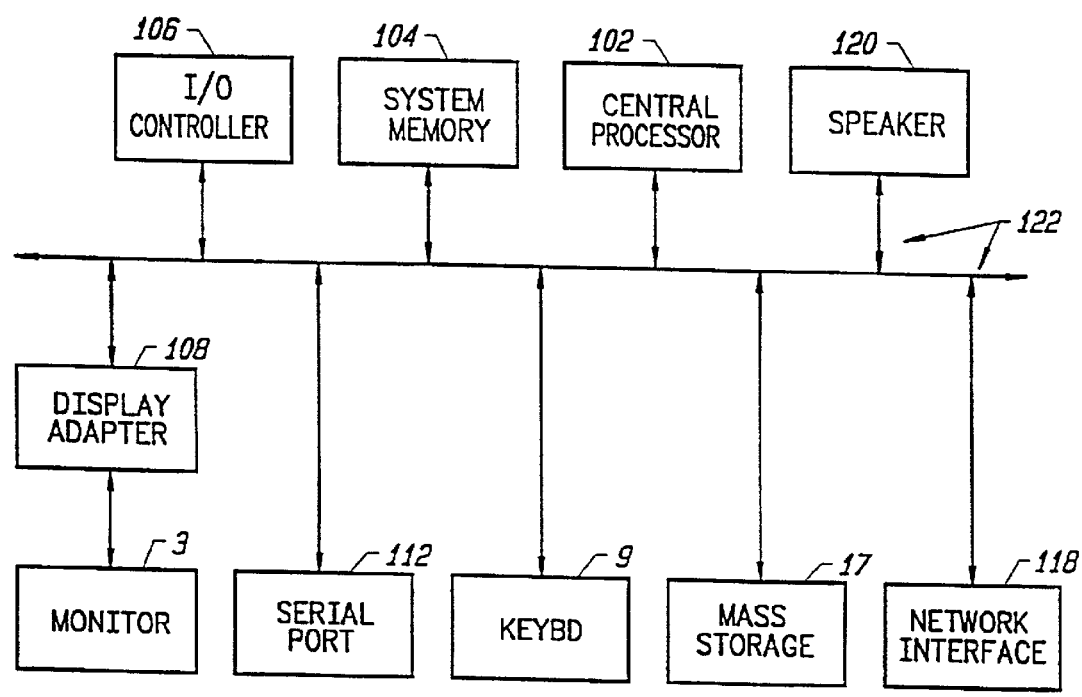
FIG. 2 shows a system block diagram of a computer system used to execute the software of the present invention.

FIG. 2 shows a system block diagram of computer system 1 used to execute the software of the present invention. As in FIG. 1, computer system 1 includes monitor 3, keyboard 9, and mass storage devices 17. Computer system 1 further includes subsystems such as central processor 102, system memory 104, input/output (I/O) controller 106, display adapter 108, serial port 112, network interface 118, and speaker 120. The invention may also be use with computer systems with additional or fewer subsystems. For example, a computer system could include more than one processor 102 (i.e., a multiprocessor system) or a system may include a cache memory.

Arrows such as 122 represent the system bus architecture of computer system 1. However, these arrows are illustrative of any interconnection scheme serving to link the subsystems. For example, speaker 120 could be connected to the other subsystems through a port or have an internal direct connection to central processor 102. Computer system 1 shown in FIG. 2 is but an example of a computer system suitable for use with the present invention. Other configurations of subsystems suitable for use with the present invention will be readily apparent to one of ordinary skill in the art.

A system including a computer or other programmed machine executing electronic design automation (EDA) software is used in the design of integrated circuits. EDA software tools include schematic editors, performance estimation software, circuit simulators, layout editors, design rule checkers, parasitic extractors, and many others. In a preferred embodiment, the techniques of the present invention are implemented in an EDA software program and executed on a computer. The software of the present invention provides performance estimation and verification of integrated circuits. The software may be stored on a mass storage device such as a disk drive or other computer readable medium, and then loaded (partially or entirely) into the memory of the computer for execution.

Figure 3:
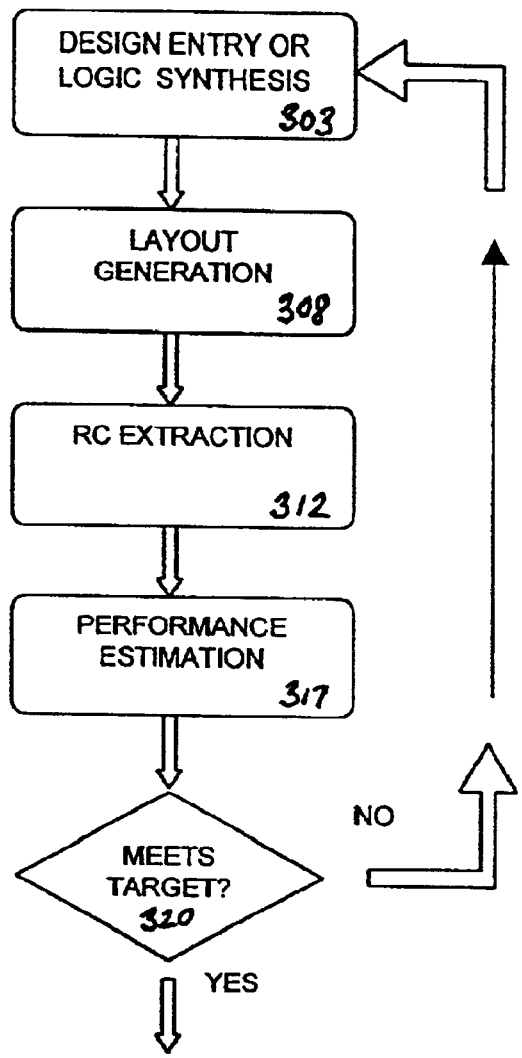
FIG. 3 shows a flow diagram for the design of an integrated circuit.

FIG. 3 shows a design flow for the design of an integrated circuit. This process may be used to design of a deep-submicron integrated circuit. In step 303, the design of circuitry and logic gates for the integrated circuit is defined. A circuit or logic design engineer defines the integrated circuit by inputting a schematic, specifying the logic using a high level design language (e.g., VHDL or Verilog), or otherwise synthesizing the logic. The result is a netlist file containing components and connections between the components. Interconnections between the components are referred to as nets. The netlist file can also be used to estimate performance of the circuitry and verify proper functionality of the logic. For example, a Spice file can be created from the netlist. A circuit simulator such as Spice uses the Spice file to estimate the timing of the circuity.

In step 308, a layout for the integrated circuit is created. The layout can be manually generated or automatically generated. The layout is typically contained in a database file such as a GDSII format file. The layout contains polygons and geometries on various layers that are used to generate the mask set for fabricating the integrated circuit. In step 312, parasitic and other parameters affecting circuit performance are extracted from the layout. Before the layout is prepared, the design engineer cannot be certain of what the parasitic capacitance and resistance the nets will be. Using the layout, the lengths, widths, area, and sizes of various circuit paths are measured. The capacitance and resistance parameters for a process technology are defined in a technology model file. Using these process parameters and the circuit path information, the parasitic capacitances and resistances are calculated. Parasitic capacitance and resistance creates propagation delays based on resistance-capacitance (RC) delay.

In step 317, the parasitic capacitances and resistances are put into the netlist or Spice file. This approach is referred to as backannotating the parasitics into the simulation file. The circuit simulator analyzes and estimates the performance of the circuitry with the parasitic resistance and capacitance information. In step 320, the design engineer looks at the performance estimates to see whether they meet the performance targets. If not, the design engineer may need to make changes to the circuit or logic design or layout. If the performance targets are met, the integrated circuit design can be fabricated.

Although the techniques may be applied with any process technology, in an embodiment, the invention specifically handles CMOS technology. CMOS technology makes use of PMOS and NMOS transistors. A MOS transistor has drain, gate, source, and substrate or well connections. A size of a MOS transistor is defined by its gate width (W) and channel length (L). The principles of the invention are applicable to designs using technologies other than MOS transistor technology by analogy. For example, an NMOS transistor has a source and a drain which are analogous to the collector and emitter of a npn bipolar transistor.

Some factors to consider when designing integrated circuit is that with advances in process technology, integrated circuits continue to become smaller and faster. Channel lengths of transistors are much less than one micron. In fact, integrated circuits are being designed with transistors having channel lengths in the range from about 0.18 microns to 0.35 microns. And, in the future, transistors will undoubtedly have even shorter channel lengths. The channel length is also referred to as "L effective" or Leff. The characteristics and performance of short-channel-length transistors are governed in part by what are known as short channel effects. For long channel length transistors such as those with channel lengths greater than one micron, the short channel effects are largely negligible compared to the basic transistor characteristics. However, for short channel transistors, the short channel effects are significant and become more of a dominant factor in the performance. Short channel effects are modeled using somewhat complex equations, and consideration of short channel effects generally requires more computing time.

As process technology advances, integrated circuits generally become smaller. More transistors and circuits are being placed on a single chip. Consequently, there are a greater number of circuit paths within the integrated circuit for which the performance needs to be considered. And, to make the task more complicated, some of the paths may be dependent on other paths. To estimate the performance of the integrated circuit, each of the various paths needs to be identified and analyzed. The performance of these circuit paths are compared against the target of expected performance for the integrated circuit. As the number of circuit paths increase, there will be more paths to check, and this will increase the computing time.

A typical integrated circuit system can be divided into a number of functional blocks ranging in size from about 50,000 to over 500,000 transistors. During the initial phases of the design process, integrated circuit designers create functional blocks with estimated resistive and capacitive interconnect models. Later on in the design cycle, accurate netlists for the functional blocks may be extracted from layout geometry. Extracted netlists are typically very large. For example, a 500,000-transistor design may contain from 3 million to 5 million devices (including MOSFETs, resistors, and capacitors) after extraction.

Therefore, when designing a modem integrated circuit, it is important to consider short-channel or deep-submicron transistor effects and interconnect behaviors to obtain an accurate performance estimate. It is important to consider all the critical circuit and performance paths. And, it is important that these performance estimates be done efficiently to minimize processing time of the system.

Figure 4A:
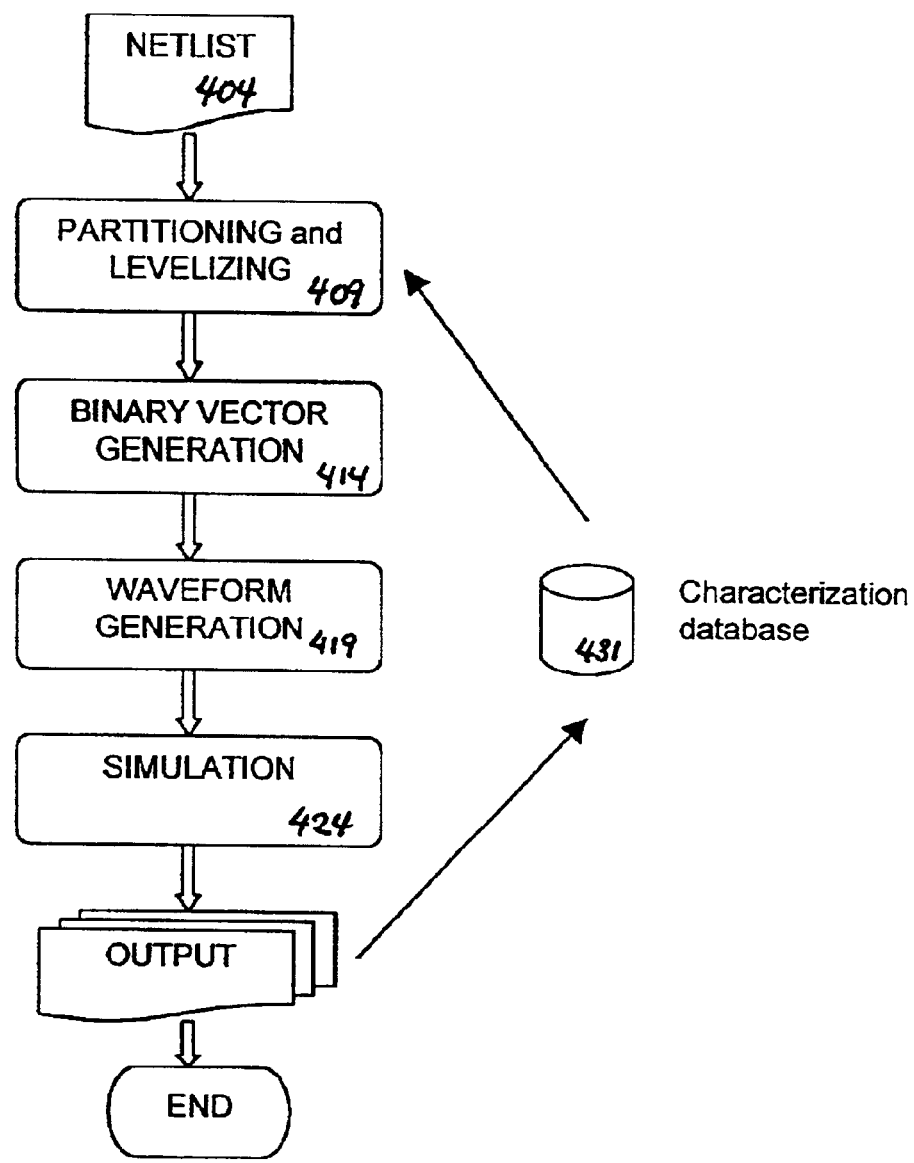
FIG. 4A shows a flow diagram of a technique of performance estimation of the invention.

FIG. 4A shows a flow diagram for a technique of the invention to estimate the performance of an integrated circuit. An example of computer software that may be used to perform performance estimation of integrated circuits is the DynaBlock™ software. A source code listing in the C++ programming language is provided in the microfiche appendix. Other examples of performance estimation software include DynaCore™, DynaRAM™, and DynaCell™. The technique of the present invention includes areas from logic minimization to automated test pattern generation (ATPG), switch-level analysis simulation, and graph isomorphism.

In step 404, the invention takes as input either a prelayout or extracted netlist for a design. The input also includes boundary information such as inputs, outputs, clocks, input arrival time windows, and output required time windows and clock timing information. Additionally, the user can specify input waveform information, such as rise and fall slew rates, and second-order rate of change of slew information. This second-order information allows the tool to model the input waveform very accurately. Since the input waveform may affect the performance of the integrated circuit, the user can specify the input waveform and evaluate its effect on performance.

In step 409, the netlist is partitioned into strongly coupled components (SCCs), which are fundamental units of analysis. One SCC may also be referred to as one partition. Strongly coupled components typically range in size from, for example, 5 to 2000 transistors. Strongly coupled components are analyzed in level order, and logic functions are derived for the outputs of the strongly coupled components including the effect of charging and discharging times. Strongly coupled components are then classified as combinational or state holding. The logic functions are represented using a modification of ordered-binary-decision diagrams (OBDDs).

In step 414, the logic functions are used derive a set of sensitizing vectors for each SCC output. During the sensitization process, great care is taken to generate true vectors that do not cause a conflict or exercise "sneak" paths. A conflict occurs when there are simultaneous charging and discharging paths in the SCC. Conflicting or false paths cause problems during simulation because they lead spurious (usually high) delay results. The result of the sensitization process is a set of vectors for the slowest and fastest input sequences for each output of a strongly coupled component, taking into account the state-dependent behavior of the SCC.

The sensitization process may generate a large number of vectors, especially for strongly coupled circuits such as barrel shifters and wide multiplexers. A two-level logic minimization algorithm is utilized to reduce the vector set. The minimization algorithm models the delay of a term to obtain a reduced set of delay vectors.

Subsequently, in step 419, waveform stimulus is generated for the strongly coupled components taking into account the arrival time windows at a strongly coupled component. Each strongly coupled component is simulated in level order. Input waveforms are modeled using a three-coefficient piecewise linear function.

In step 424, the user simulates the circuitry. The technique of the invention allows the user to choose among different simulation techniques providing the designer trade off between run time and accuracy. For example, some of the simulation techniques the user can choose include the high performance simulation technique of the invention, commercially available Spice software, and commercially available piecewise linear simulation. The simulation is performed "in-place," to preserve the exact driver and load information for the strongly coupled component.

The simulation technique of the invention performs output data reduction and circuit equation reduction to speed up simulation and reduce memory consumption without sacrificing accuracy. A two-terminal capacitor model, such as a BSIM3 version 3 capacitor model, is used to speed up simulation of load devices. The BSIM user's guide is incorporated by reference.

Output delays and output waveform shape coefficients are derived from the simulation and this information is passed to the next strongly coupled component in level order. Since dynamic simulation is utilized during the delay calculation process, the present invention permits the accurate modeling of the effects of coupling capacitance, simultaneous-switching, and waveform shape.

A technique of the invention is to maintain a database 431 of strongly coupled components and their associated characterization information during its operation. Using this technique reduces the execution time of the software. Before a strongly coupled component is simulated, a database search is performed to identify a match based upon topology, load and input arrival, and slew. If a match is found in the database, simulation can be avoided completely. For datapath circuits such as adders, multipliers, and comparators, the time saved using this method can be enormous. When a run is completed, the database is stored on disk. Subsequent reruns of the software can utilize the information in the database. For example, during the design phase, as the designer makes modifications to the design and reruns the software, only the strongly coupled components that were not matched in the database are resimulated. This incremental recharacterization feature enables completing performance verification of multimillion-transistor designs quickly.

Figure 4B:
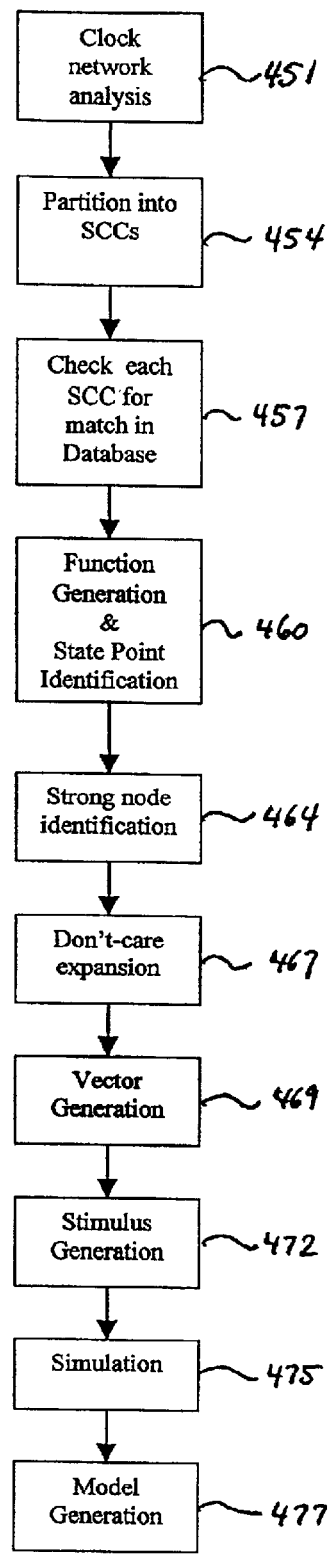
FIG. 4B shows a more detailed flow diagram of the technique of performance estimation of the invention.

FIG. 4B shows a more detailed diagram of the flow of the invention. The steps in the flow are clock network analysis 451, partition into SCCs 454, check each SCC for match in the model database 457, function generation and state point identification 460, strong node identification 464, don't care expansion 467, vector generation 469, waveform or stimulus generation 472, simulation 475, and model generation 477. More detail about these steps are provided in the source code appendix and are also discussed below. Steps 451, 454, 457, 460, and 464 are portions of circuit partitioning 409. Steps 467 and 469 are portions of binary vector generation 414.

Circuit Partitioning

In the invention, circuit partitioning is performed using a divide and conquer approach where the circuitry is broken into smaller groupings of circuit elements. These groupings of circuit elements are called strongly coupled components or SCCs. The partitioned circuit elements are analyzed and evaluated. The results of the analysis of these partitioned circuit elements are combined to determine the total result for the entire circuit block or integrated circuit. Depending on how the circuit elements are partitioned, the analysis will be performed more efficiently and accurately. A technique of the invention will partition a circuit description containing transistors, interconnect resistors, interwire coupling capacitors, grounded capacitors, and other active components. The method includes the steps of initial grouping of circuits by clock network analysis, tight coupling analysis, and state-point identification.

Clock Network Analysis

To estimate the performance of an integrated circuit, the clock network is identified. Knowing all the clock nets permits identification of state-holding subcircuits and permits setup and hold checks to be performed on clocked logic such as latches and footed and footless domino logic. It also enables setup and hold timing verification checks to be performed on primary outputs. Previous methods for tracing the clock tree involve looking for topological matches for inverters, buffers, and other gates along the clock tree. A major drawback of these techniques is that if the user changes the topology, the clock tree is no longer recognized and timing analysis is inhibited.

In the invention, starting from the user-identified clock starting points, the clock network is traced by Boolean analysis. From each user-defined clock starting point, a forward trace is performed. The forward trace identifies the channel-connected components (CCCs) connected to the clock starting point. A channel-connected component is defined to be the set of nodes and attached transistors that are strongly reachable by tracing or following source-drain connections. In the invention, this definition includes reachability through resistors and also includes any capacitors connected to the nodes that are in the channel-connected component. How CCCs are found is discussed below.

A Boolean logic function is obtained for each of the outputs of the CCC. Subsequently, a Boolean test is applied to each output of the CCC to determine whether the clock signal propagates to the output or not. If the clock signal propagates to an output, the forward trace is repeated on the output. Because the clock network is identified by Boolean analysis, even if there are later topological changes in the clock network, the clock tree will still be recognized because it has been represented functionally.

The clock input to the CCC to be analyzed is called c. A complement of the clock signal is denoted by $\bar{c}$ or c'. The function of the output to be tested is denoted by f. First, the terms of f that depend on the clock c are identified by calculating the following expression:

$$f_{c \oplus \bar{c}} = (f_c \oplus f_{\bar{c}})'f$$

The subscript denotes the cofactor operation. In order for the output to be a clock signal, the output depends on c and will be either positive unate or negative unate with respect to c. Therefore the test is:

$$(f_{c \oplus \bar{c}}|_c \neq 0 \wedge f_{c \oplus \bar{c}}|_{\bar{c}} = 0) \vee (f_{c \oplus \bar{c}}|_c = 0 \wedge f_{c \oplus \bar{c}}|_{\bar{c}} \neq 0)$$

TABLE 1

Clock Network Analysis

1. Start from a user specified clock net c.
2. Identify all CCCs connected to the clock net c.
3. Calculate the logic functions for each output of each CCC connected to the clock net.
4. For each output of each CCC connected to the clock net, test if the output depends on c and is either positive unate or negative unate with respect to c. An output is considered positive unate with respect to c if changing c from 0 to 1 (while keeping other inputs constant) always causes the output to either remain unchanged, OR, change from 0 to 1. An output is considered negative unate with respect to c if changing c from 0 to 1 (while keeping other inputs constant) always causes the output to either remain unchanged, OR, change from 1 to 0.
5. Mark each unate output as a clock net. For each unate output, repeat the clock network analysis above, until all nodes are examined.

Tight Coupling Analysis

Tight coupling analysis is a technique of identifying circuit structures that behave as a single logical unit. For partitioning of a circuit with MOS transistors, a channel-connected component or CCC is defined to be the set of nodes and attached transistors that are strongly reachable by tracing or following source-drain connections. In the invention, this definition includes reachability through resistors, and also includes any capacitors connected to the nodes that are in the channel-connected component. A first step in partitioning is to group the circuit into channel-connected components.

Figure 5:
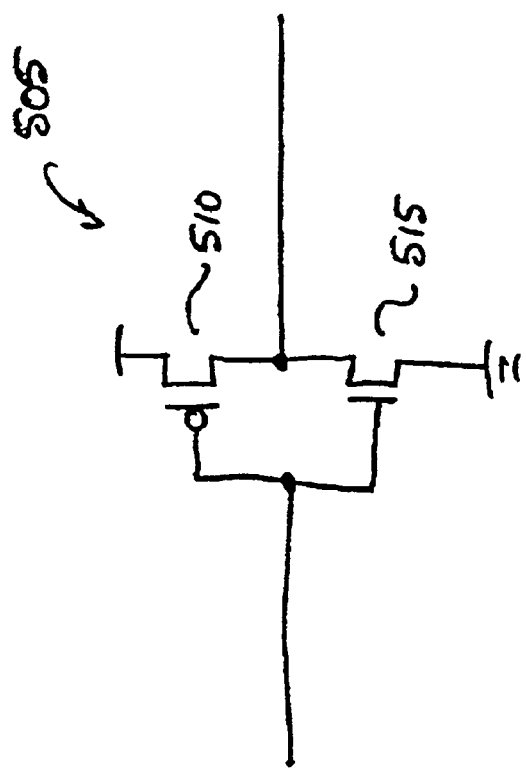
FIG. 5 shows a channel-coupled circuit.

FIG. 5 shows a standard CMOS inverter 505. This is an example of a channel-connected component. Transistors 510 and 515 of the inverter are channel-connected components. A signal can be traced from the drain to source of transistor 510 to the drain to source of transistor 515.

Figure 6:
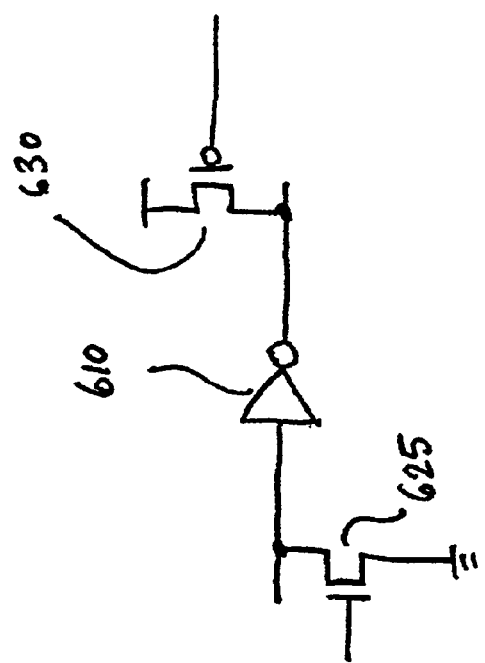
FIG. 6 shows another channel-coupled circuit.

FIG. 6 shows another example of a channel-connected component. All transistors including those used to create inverter 610, and transistor 630 are channel connected. Transistor 625 is connected to the gate of inverter 610 and is not part of the CCC of inverter 610 and transistor 630.

The behavior of a channel-connected component however cannot always be analyzed in isolation. Some circuits have feedback paths. The presence of feedback and interaction between channel-connected components can result in a combined behavior that is significantly different from the behavior of individual components. For example, large coupling capacitors between two channel-connected components can also significantly alter the timing behavior of the circuit.

The present invention analyzes the circuit for strong interaction between the components using graph traversal techniques. Channel-connected components are grouped into strongly coupled components or SCCs. Subsequently, the nodes of a strongly coupled component are classified as being an input, output, or internal. In addition to the traditional static CMOS circuits, examples of SCCs include footed and footless domino logic, differential cascode voltage switch (DCVS) logic, and similar structures with feedback.

Figure 7:
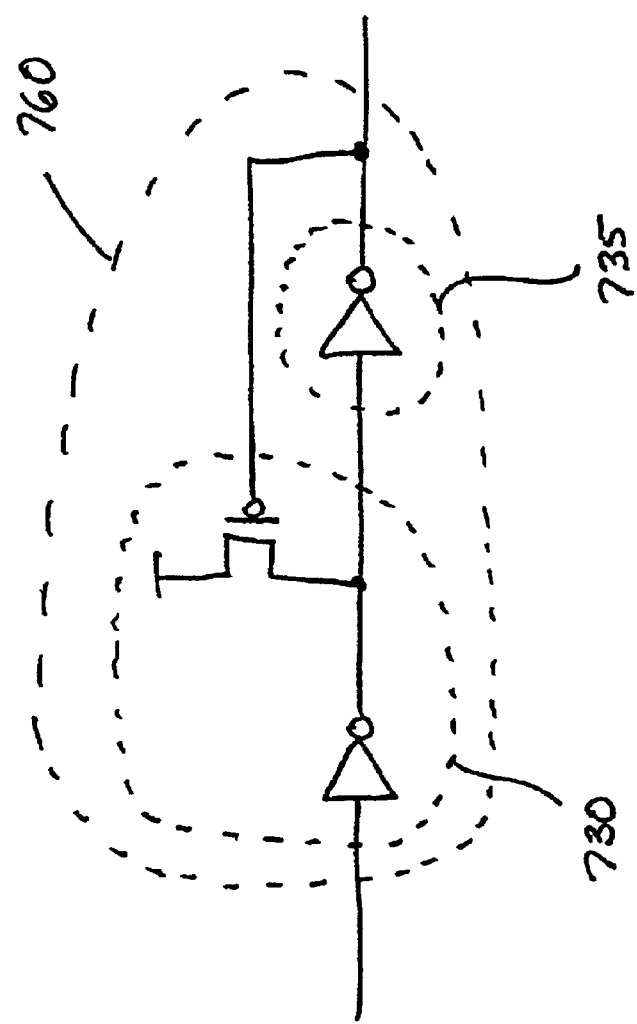
FIG. 7 shows a strongly coupled circuit.

SCCs are formed from CCCs that have a two-way influence relationship. In other words, if two CCCs are connected in a feedback loop they are merged to form an SCC. FIG. 7 shows a circuit with two channel-connected components 730 and 735. In FIG. 7, both channel-connected components 730 and 735 form a strongly coupled component 760 because the output of component 735 influences a Boolean output of component 730, and an output component 730 influences a Boolean output of component 735. These CCCs will be merged together to form an SCC 760.

Table 2 summarizes a flow for a technique of the invention for partitioning a circuit description into strongly coupled components.

TABLE 2

Circuit Partitioning

1. Identify all the channel connected components in the circuit. A channel-connected component may be defined to be the set of nodes and attached transistors that are strongly reachable by tracing or following source-drain connections. In the invention, this definition includes reachability through resistors, and also includes any capacitors connected to the nodes that are in the channel-connected component.
2. Identify inputs and outputs of all channel connected components: Gate terminals of transistors that are not driven by any other source or drain from within the channel connected component are considered inputs. Nets that are connected to the gates of transistors belonging to any other channel connected component are considered outputs.
3. While merging is still occurring: Identify pairs of channel connected components (CCC) that are connected in a feedback loop. A pair of channel connected components CCC1 and CCC2 are in a feedback loop relationship if an output of CCC1 drives an input of CCC2, AND, an output of CCC2 drives an input of CCC1. Merge the transistors, capacitors and resistors of the two CCC (CCC1 and CCC2) to form an SCC.
4. While merging is still occurring: Identify pairs of SCCs that are connected in a feedback loop. A pair of strongly coupled components SCC1 and SCC2 are in a feedback loop relationship if an output of SCC1 drives an input of SCC2, AND, an output of SCC2 drives an input of SCC1. Merge the transistors, capacitors, and resistors of the two SCCs (SCC1 and SCC2) to form SCC3.

In step 1 of table 2, the channel-connected components (CCCs) are identified by tracing source-drain connections for transistors. In step 2, the inputs and outputs are identified.

In step 3, the strongly connected components are identified from these channel-connected components. SCCs are formed from CCCs that have a two-way influence relationship. In other words, if two CCCs are connected in a feedback loop they are merged to form an SCC. FIG. 7 shows an example of two CCCs with a feedback relationship. CCCs are merged into a single SCC, such as SCC 760. SCCs will be considered and analyzed as a single component.

In step 4, SCCs are examined to determine if additional merging is possible. For example, SCCs generated from step 3 may have may have additional feedback or coupling and could be combined with other SCCs. In step 4, larger groups absorb smaller groups. This will grow the clusters to build bigger SCCs.

Figure 8:
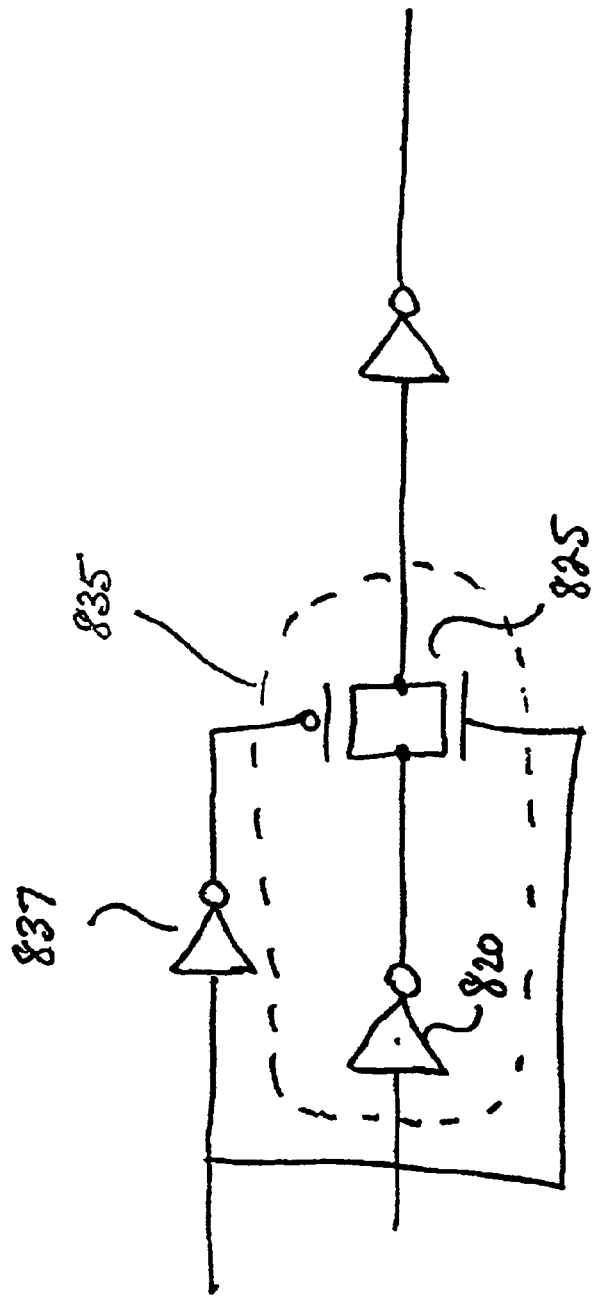
FIG. 8 shows another strongly coupled circuit.

When the above technique is applied to the circuit in FIG. 8, in step 1, an inverter 820 and a transmission gate 825 will be identified as a channel-connected component 835. Inputs and outputs are identified in step 2. In step 3, CCC 835 will be combined with inverter 837 to form a strongly coupled component because both the input and the output of the inverter 837 drive the CCC identified in step 1. In other words, the inverter 837 is fundamental to the operation of the transmission gate so it will be combined with CCC 835 to form an SCC.

In an embodiment of the present invention, while identifying the strongly coupled components in steps 3 and 4, the state points or state-holding nodes are also identified too. State points are discussed below.

State-Point Identification

State-point identification is a process of identifying functional circuit structures that are capable of holding a binary state for a duration that is significantly longer than the circuit response time. Examples include, but are not limited to, sequential-type logic circuits, latches, flip-flops, registers, and memory cells. One approach to identity these types of circuit elements is to use pattern matching against a library of patterns to identify such structures. A drawback of such an approach however is that the library needs to be constantly updated as circuit styles evolve. Additionally, pattern matching is slow and run times increase dramatically as the library size grows.

In an approach of the present invention for state-point identification, a Boolean logic function is derived for each output and storage node of a strongly coupled component. The logic function for a node n consists of four subfunctions: $F^n = (f0, f1, f0', f1')^n$. Some of these subfunctions may be empty functions. The functions are generated by path traversal and are compactly represented by OBDDs. For a node in a strongly coupled component, function f0 denotes the Boolean condition (with respect to the inputs of an SCC) under which the node has a path to a "0" (or a discharge path). Function f1 denotes the Boolean condition under which the node has a path to a "1" or a charging path. Function f0' denotes the condition under which a node has no discharging path. Function f1' is the condition under which the node has no charging path. Note that circuit topologies commonly occur for which f0' may not equal the complement of f0.

After the circuit is divided into SCCs, the state holding nodes are identified. A node within an SCC is defined as state holding if (a) there is an input vector that can charge the node to 0 or 1, and subsequently an input vector can be applied such that the node is neither charged to 0 nor to 1 (which means the node is floating); and (b) the node is capable of holding a charge for a period of time that is much larger than the clock frequency of operation of the circuit.

In an embodiment of the invention, a Boolean test is applied to determine if (a) is possible. The Boolean test is (f0 !=0 OR f1 !=0) AND (f0' AND f1'). This equation states that a strongly coupled component is state holding if there exists a combination of inputs that can either charge or discharge a node n, and there exists a combination of inputs such that node n is neither charged nor discharged (holds state). In order to test for (b), a method of the invention calculates the effective node capacitance based on commonly known criteria. If the effective node capacitance is greater than a user specified threshold, the node is considered having passed criterion (b).

The response time of stateless strongly coupled components can be characterized by applying a stimulus independent of a previous state. On the other hand, previous state information should be utilized to analyze state-holding strongly coupled components.

Vector Generation

Figure 10:
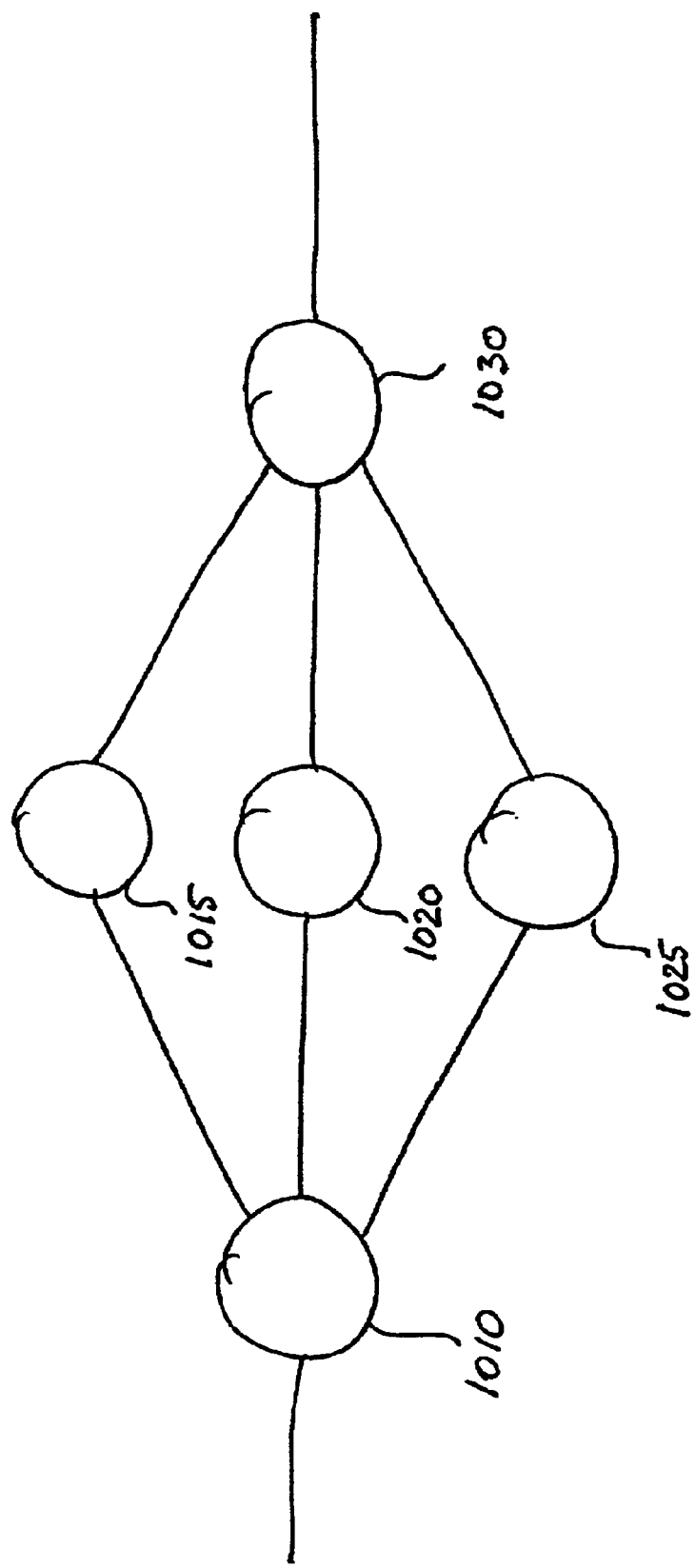
FIG. 10 shows a circuit description partitioned into strongly coupled components.

After the circuitry has been partitioned in SCCs, the performance of each of the SCCs or partitions is analyzed. FIG. 10 shows a diagram of circuitry which has been partitioned into a number of strongly coupled components 1010, 1015, 1020, 1025, and 1030. The diagram also shows how the strongly coupled components are connected to each other. Each strongly coupled component will be evaluated to determine its performance. The performance of the paths of the integrated circuit will be calculated by adding together the performance results from the individual SCCs along these paths.

Vector generation is the process of determining the inputs to each strongly coupled components which will be used to estimate the performance of the components. A first step in vector generation is to obtain a Boolean function for each internal storage node and output of a strongly coupled component. A technique of the present invention is an extension an ordered-binary-decision-diagram-based or OBDD-based approach. An OBDD-based approach typically derives conditions for a node to be charged to a "1" state or a "0" state. In the present invention, however, four functions are derived for a node: (f0, f1, f1', f1')$^n$. The functions are generated by path traversal and are compactly represented by OBDDs. For a node in a strongly coupled component, f0 denotes the Boolean condition (with respect to the inputs of an SCC) under which the node has a path to a "0" (or a discharge path). Subfunction f1 denotes the Boolean condition under which the node has a path to a "1" or a charging path. Subfunction f0' denotes the condition under which a node has no discharging path. Subfunction f1' is the condition under which the node has no charging path. Note that circuit topologies commonly occur for which f0' may not equal the complement of f0. Using f0 and f1' or f1 and f0', the delay for the 0 to 1 or 1 to 0 transition can be determined.

The OBDDs are used to generate tables for the four functions of each output of the SCC, where each cube (or term) of the table represents a valid, nonconflicting input vector for the SCC. Table generation from OBDDs can generate a very large number of cubes and is heuristically limited by a user-specified constant. For each possible pair of cubes represented by the transitions f0 to f1, f1 to f0, (f0' AND f1') to f1, and (f1' AND f1') to f0, the switching delay is estimated for each output. The switching delay estimate is a function of the charging current along the switched path and the capacitance charged or discharged by the switching functions. The cube pairs may be ordered by estimated switching delay. The switching delay can be estimated by using a fast delay modeling technique such as described in A. Salz & M. Horowitz, IRSIM: *An Incremental MOS Switch-Level Simulator*, in Proc. of the Design Automation Conf. 173–78 (1989), which is incorporated by reference, or any circuit simulator specified by the user.

Table 3 shows an example of a transition delay table. Each row or line in the lists the performance results for inputs "abc" changing from the vector in the first column of the table to the vector in the second column of the table. Xs represent don't cares. The corresponding output transition is in the third column. The fourth column gives the performance delay. The fifth column gives the switching capacitance.

TABLE 3

Transition Delay Table

| Inputs From Cube abc | Inputs To Cube abc | Output Transition | Delay | Switching Capacitance |
|---|---|---|---|---|
| 0X1 | 11X | 0 to 1 | 0.27 | 0.08 pf |
| X10 | 01X | 0 to 1 | 0.27 | 0.05 pf |
| 11X | 0X1 | 1 to 0 | 0.23 | 0.07 pf |
| 11X | 000 | 0' AND 1' to 1 | 0.22 | 0.07 pf |
| 11X | 0X1 | 0' AND 1' to 1 | 0.20 | 0.03 pf |

A transition delay table is generated for each of the outputs of the SCCs. From each of the tables, some of the vectors are selected. In an embodiment, the k fastest and slowest transitions are selected, where k is a user-specified limit. A restricted form of multiple output cube minimization is performed on the combined delay table of all output to reduce the number of vectors. This reduces simulation time.

Although the sample table shown is for transition delays, other performance characteristics or parameters may also be estimated using the invention. The performance characteristic of interest will be stored in the table. For example, the power characteristics (such as current consumption) may be the estimated parameter. Then the table may instead be referred to as a power consumption table.

The function of the SCC is expanded and stored in table format. Each line in the table estimates the delay or other performance characteristic for a particular vector. The user selects how many vectors to simulate. Simulating more vectors will take more simulation time. The vectors may be ordered from worst to best delay times. The simulation is performed using a circuit simulator of the user's choice and the output waveform from the circuitry simulator is captured and stored.

When storing the output waveform, a technique of the invention to reduce the amount of storage space used is by compressing the data. This is important for large integrated circuits where there are many SCCs. Even though memory capacity for computers is generally growing, it is still important to conserve memory space because doing analysis on large integrated circuits will rapidly consume the available memory space. Also, efficient memory use will increase execution speed by making more memory available for other processes and reducing memory transfer times. One technique to compress the waveform data is using a piecewise linear model. A number of points in the waveform are stored. Then, straight lines will be drawn through these points to re-create the original waveform. Storing fewer points will result in greater compression, but the waveform is stored in a potentially less precise form.

After the performance results for each of the SCCs is determined, the performance for the various paths of the integrated circuit design is obtained by adding together the performance delays for the SCCs for the paths. By comparing the total performance delay for the various paths, the worst best or case path can be determined. For some input conditions, the integrated circuit design may exhibit performance that is worse or better than for other input conditions. Since best case and worst case vectors are kept in the table, the best and worst case performance conditions and results can be determined.

In an embodiment, the invention is a method of estimating the performance of an integrated circuit design including selecting a circuit block of the integrated circuit design. The circuit block may be described in Spice, netlist, or another similar format. A logic function is obtained for a node of the circuit block. In a specific embodiment, the logic function includes four Boolean subfunctions, f0, f1, f0', and f1', as described above. Using the logic function, a set of vectors found that will switch or transition the logic function at the node. A table is formed which includes the set of vectors. The table will include the performance results.

Figure 13:
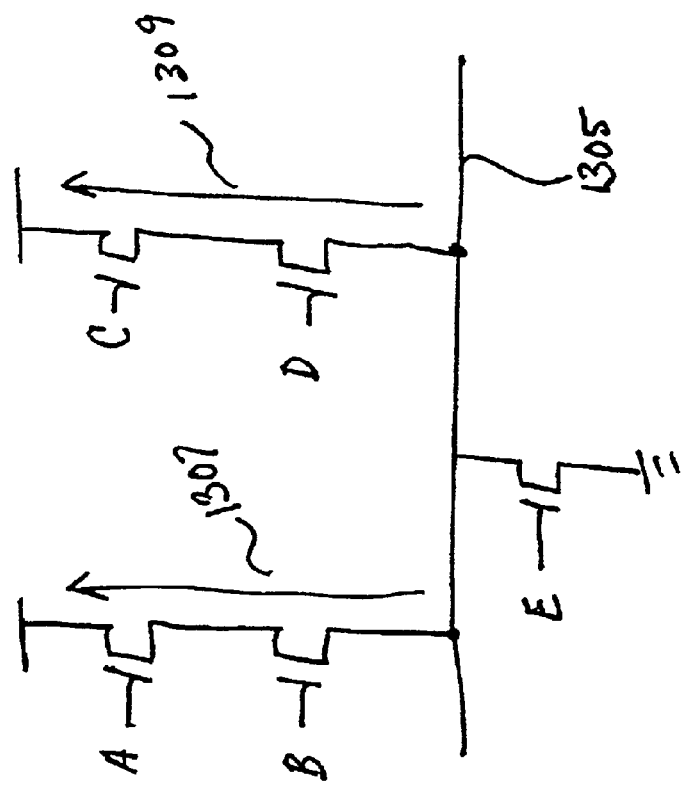
FIG. 13 shows a strongly coupled circuit where logic functions are to be determined at a node of the circuit.

To find the f0 or f1 functions, trace all the paths from the node to a voltage source. For f0, the voltage source will be ground or VSS, and for f1, the voltage source will be VCC or VDD. For each of the paths, take the logical AND of the Boolean conditions that enable the transistors to be turned on. Then, take the logical OR of the logical ANDs conditions just calculated. For example, referring to the circuit in FIG. 13, to determine function f1 for node 1305, there are two paths 1307 and 1309 to VCC. The Boolean condition to turn on path 1307 are A*B (A and B are logically ANDed). The Boolean condition to turn path 1309 on are C*D (C and D are logically ANDed). These Boolean conditions are logically ORed to obtain f1=A*B+C*D. Function f1 represents the Boolean conditions under which node 1305 gets to a logical 1. The technique to find f0 is analogous and is obtained by tracing the paths to VSS. For the circuit in FIG. 13, f0=E. Function f0 is the condition for node 1305 to be discharged or 0.

To find f0' and f1', the paths are traced from the node to a voltage source. For f0', the voltage source will be ground, and for f1', the voltage source will be VCC. For each of the paths, take the logical OR of the Boolean conditions that disables or turns off the transistors along that path. Then, take the logical AND of all the logical ORs just calculated. To obtain f1' for the circuit in FIG. 13, for path 1307, the Boolean condition will be A'+B' (which will turn off path 1307 to VCC). For path 1309, the condition will C'+D'. The function for f1' is (A'+B')*(C'+D'), which represents the Boolean condition under which there is no charging path for node 1305. In an analogous fashion, the function f0'=E' is determined. Function f0' is the condition for node 1305 under which there will not be a discharging path.

Strongly Driven Nodes

In a circuit description, some of the source-drain paths may be false paths. The function for these false paths should not be evaluated or simulated. To avoid evaluating false paths, an exhaustive path search approach may be used for function computation. That technique exhibits exponential complexity and fails on circuits such as wide shifters and pass-transistor topologies where it is needed most.

An approach of the present invention to resolving charge sharing and conflicts relies on finding "strongly-driven" nodes and has proven itself to work reliably on a large class of CMOS digital circuits. Let s(f) for a node n denote the strength of the weakest charging or discharging path in the set of input vectors contained in f. S(f) denotes the strength of the strongest charging or discharging path in the set of input vectors contained in f. A node n is defined as strongly driven if it satisfies the following conditions:

$$(\exists F^s \subseteq F^n | (f_0{}^s = \bar{f}_1{}^s) \wedge (\exists \sigma | s(F^s) > S(F^n - F^s))$$

This equation states that the function at the node n has a static $(f_0{}^s = \bar{f}_1{}^s)$ subset that is stronger than any other subset of $F^n$ at the node. In other words, a node is strongly driven if it is driven by a static CMOS subcircuit and the drive strength of the static CMOS subcircuit is greater than the drive strength of any other path through that node. Once a node is identified as strongly driven, the function for that node is set to the static subset $F^s$ and sneak paths traversing through that node are suppressed.

Figure 9:
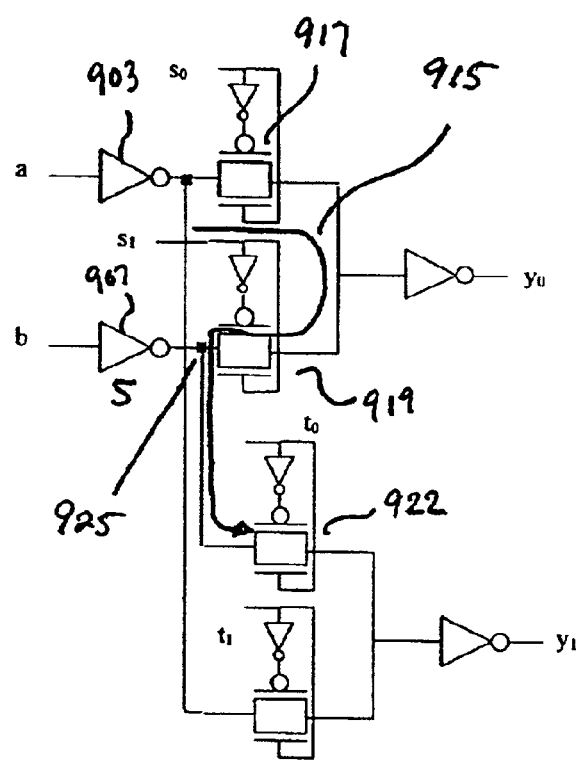
FIG. 9 shows a multiplexer circuit as an example of a strongly coupled component.

FIG. 9 shows a multiplexer circuit. Input a is connected to inverter 903, and input b is connected to inverter 907. A path 915 from the output of inverter 903 through transmission gates 917, 919, and 922 is a false path. This is a false path because, although it is possible path, path 915 is not a path that will typically occur during the operation of the multiplexer. A technique of eliminating this false path is to assign drive strengths to each of the static logic elements. The drive strengths of the logic elements will be based on the W/L ratio of the devices. A logic element is considered static if f0 is equal to f1'. For example, inverter 907 has a drive strength of 5, while inverter 903 has a drive strength less than 5. Then, using the technique of the invention, because inverter 905 driving node 925 has the greatest drive strength, other logic elements such as inverter 903 will not be permitted to drive through node 925. This will cut off and eliminate false path 915. By eliminating false paths, this speeds up the process of estimating the performance of the circuit.

Don't-Care Expansion

Don't-care expansion is a process of selecting vectors to avoid conflicts or improper logical outcomes. Don't-care expansion eliminates vectors that cause false paths, which will speed up the performance estimation process. In the binary domain, $f_0$ and $f_1$ for output y0 do not depend on $t_0$ and $t_1$. Hence, the tables for $y_0$ will have don't cares in the positions corresponding to $t_0$ and $t_1$. During simulation however, proper stimulus must be generated for $t_0$ and $t_1$. Setting $t_0$ and $t_1$ to a random value such as "0" will cause a conflict or collision at $y_1$. In order to eliminate the possibility of collision when simulating an output $y_1$ the technique of the invention accepts only those vectors that satisfy the following equation:

$$\bigcup_{i \ne j} ((f_0^j \wedge f_1'^j) \vee (f_1^j \wedge f_0'^j))$$

This equation states the space into which a don't care is expanded does not contain collisions, or invalid (floating) node states. Don't cares in a term are "expanded" (assigned a "0" or "1" value) in such as way that the above equation continues to be satisfied.

Figure 12:
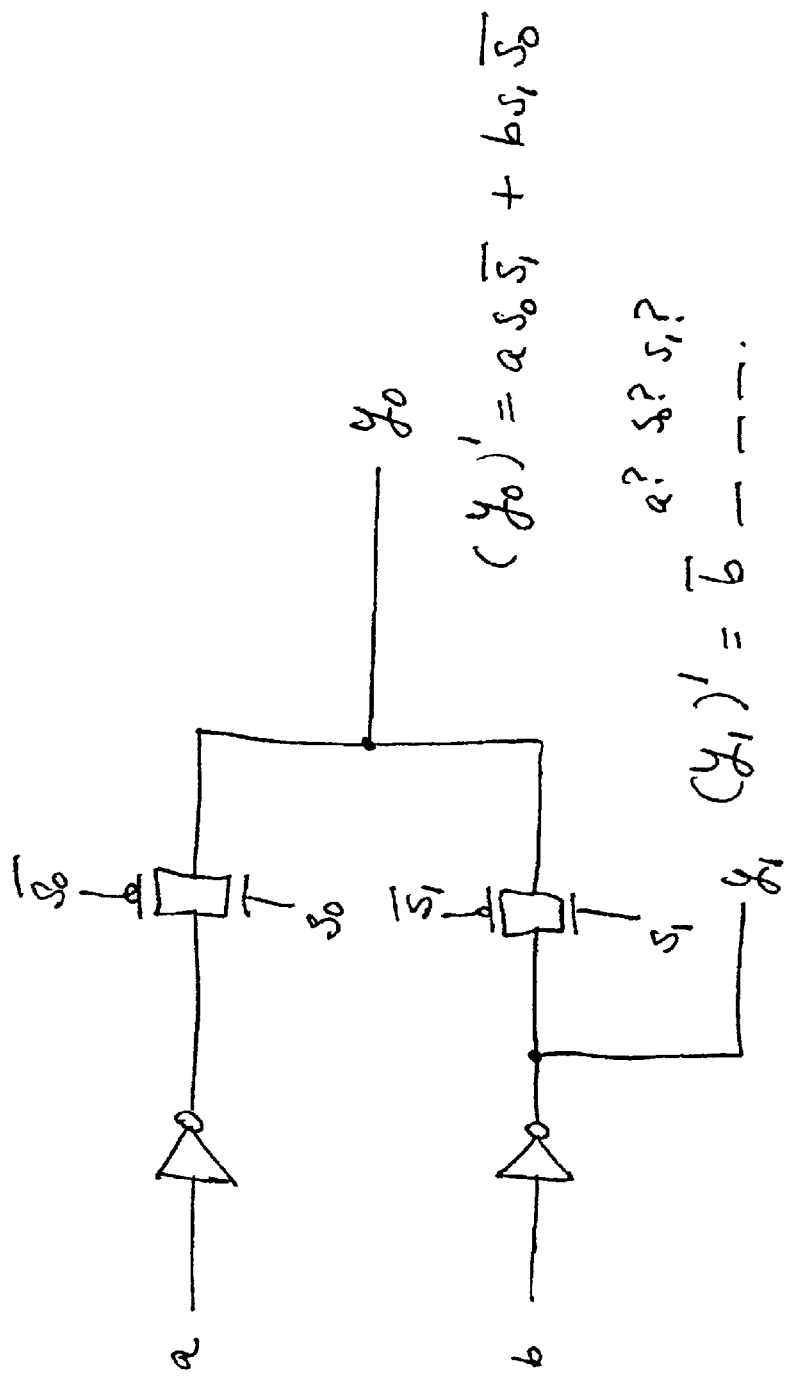
FIG. 12 shows a multiplexer circuit with output functions that can be handle using don't care expansion.

For example, in FIG. 12, there is a logical function for with inputs a, b, s0, and s1 and outputs y0 and y1. In an embodiment of the invention, the logical functions are expressed in (or converted to) sum of products format. The Boolean equations are (y0)'=(a*s0*/s1)+(b*s1*/S0) and (y1)'=/b. Don't care expansion will determine legal values for the missing inputs, a, s0, and s1, for y1 that will avoid conflicts for y1. It is logically possible for input a to part of the function for y1. However, this is a false path. In the operation of the multiplexer, input a will not be part of the y1 output because inputs s0 and s1 will not be asserted in such a way to permit this conflict. Therefore, using the technique of the invention, valid values for a, s0, and s1 are selected to prevent this conflict situation from occurring. For example, s1 will be a 0.

Stimulus Generation

Automatically generating the sequence of waveforms required to properly simulate an SCC requires careful analysis, especially for complex clocked logic such as footed or footless domino logic, and latches or flip-flops. There are wide variations in design styles and requirements. For example, for footed domino logic, a common requirement is to time the arrival of inputs well before the precharge cycle is complete. This requirement however may not hold for domino circuitry that is connected to primary inputs. For footless domino logic, a requirement is that the data signals become inactive before that precharge starts. The stimulus generation algorithms of the invention take into account all of these complexities while generating proper waveforms.

Figure 11:
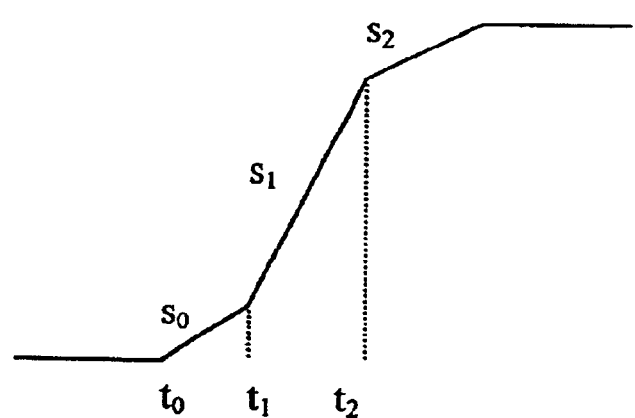
FIG. 11 shows a waveform represented using a set of coefficients.

After obtaining an optimal vector sequence for a strongly coupled component, input waveforms are generated for accurate simulation. A waveform is represented by a set of coefficients as shown in FIG. 11. The waveform is stored in compressed form using a piecewise linear model. Points of the waveform at t0, t1, and t2 are stored, instead of storing the complete waveform. To reconstruct the waveform from these points, straight lines are drawn between the points.

The coefficients for the inputs of an SCC are obtained from the waveforms of the fan-in SCCs, or the primary inputs if the SCC is driven by primary inputs. An SCC is simulated "in-place" with the actual drivers and receiving transistors to obtain the most accurate delay measurements.

For stimulus generation, each SCC is identified as being a sequential or nonsequential (i.e., combinatorial) function. A sequential function is one that involves latches, flip flops, domino logic, and the like. If the function is sequential, then a vector is applied to the SCC that sets up the initial conditions. This is because for sequential functions the next logic state depends on the previous logic state.

Next, a vector is applied to the sequential or nonsequential SCC to cause its output to switch. The vectors are applied to the SCC as an input waveform. This input waveform will be analogous to the output waveform of a previous SCC in the path. The waveform may be stored in a compressed format as discussed later. Then, the previous output waveform reconstructed from the compressed format and used as the input waveform for the SCC.

Simulation

A large design will generally have a large number of SCCs which need to be simulated quickly. In order to maintain high accuracy, in an embodiment, the invention performs complete Spice-level numerical simulation utilizing industry-standard BSIM3 version 3.2 device models. In order to speed up the simulation without sacrificing accuracy, the invention provides some improved simulation techniques.

One of the techniques of the invention is to use an output data reduction. The output voltages are stored only at the time points at which they cross threshold values. The threshold values are user selectable. Typically, the threshold values are selected to represent 10 percent, 50 percent, and 90 percent levels of the supply voltage. For example, only the performance delays to achieve the 10 percent, 50 percent, and 90 percent of the VDD or VCC voltage level will be stored. Since scalar values or quantities are stored, and not the entire waveforms. This saves storage space. In this example, only three values are stored. In other embodiments, any number of performance values may be stored depending on the threshold values the user is interested in. This feature also speeds up the design characterization process and reduces the amount of data exchange operations.

Circuit performance quantities such as average, maximum, and minimum voltage and current values, delays, and rise and fall times are calculated during simulation. The simulator internally calculates and returns scalar quantities rather than voltage and current waveform data. This feature speeds-up the design characterization process and reduces the amount of data exchange operations.

Typically, the SCC submitted to simulation contains many load MOSFETs connected to the component output pins. During simulation those load BSIM3 version 3 MOSFETs are simulated using two-terminal capacitance models, instead of using transistor models. These models are fully compatible with the general BSIM3 version 3 intrinsic capacitance models. This feature speeds-up the design characterization process significantly without loss of accuracy and reduces the memory consumption. Simulating using a capacitance model will generally be faster than using a transistor model.

The invention uses circuit equation reduction. The technique reduces the number of circuit equations by excluding certain unknown variables. For each DC voltage source of the circuit, its current and node voltage are calculated explicitly using Kirchoff current and voltage laws rather than by including them into system of equations. The unknown variable elimination significantly reduces the sparse solver fill-in. This feature further speeds-up the simulation process and reduces the memory consumption.

For each strongly coupled component, the present invention can generate a complex delay model (e.g., a look-up table or polynomial equation) by simulating the SCC for a range of slew rates or for SCCs that drive primary output, for a range of slew rates and loads. Alternatively, if the slew rates at the primary inputs and loads at primary outputs are known a-priori, an exact instance-specific delay model can be generated. An exact model is applicable in aggressive custom design during the design process, where the environment of a block within a design is well known. The complex model is useful for intellectual property (IP) cores that will be used in a wide variety of applications.

Folded Model Generation

The present invention maintains a database of previously simulated SCCs, along with input waveforms and simulation results. If the current SCC to be simulated "matched" a previously stored SCC in the database, simulation can be avoided. Two SCCs are said to match if they have identical circuit topology, their input waveform coefficients are within some constant a of each other, their active device sizes or values (MOSFETs, resistors, and capacitors) are within some constant b of each other and their output load device sizes or values are within some constant c of each other.

The SCC database is stored and reused during subsequent runs of any other design. Thus, if the software of the present invention is run twice on the same design without any changes, simulation is completely avoided. This increases the execution speed of the present invention.

In an embodiment, the method of estimating the performance of an integrated circuit design includes making a first estimation of the performance of the integrated circuit design. During the first estimation of the performance of the integrated circuit design, a database is created to store estimated performance results for the integrated circuit design. The database is typically stored on the disk. This is a persistent database that is accessible and may be reused during subsequent executions of the software. The type of information that can be stored and reused are simulation results, partitioning information, transient delays, slope information, or simulation data, or any combination of these. Slope information is the rate of output waveform rise or fall (i.e., dI/dt or dV/dt).

A second estimation of the performance of the integrated circuit design is made. During the second estimation of the performance of the integrated circuit design, the database is read. The stored estimated performance results of at least a portion of the integrated circuit design are used, where the performance results for the portion of the integrated circuit design was estimated during the first estimation. This avoids calculation of the performance results for the second partition.

In particular, when performing the second estimation, a partition or SCC and its stored estimated performance results were stored in the database during the first estimation. A second partition is obtained during the second estimation of the performance of the integrated circuit design. The second partition is compared to the first partition. If the first and second partitions match, then the stored estimated performance results for the first partition are used as the estimated performance results for the second partition. Calculation of the estimated performance results for the second partition is avoided, which speeds up the performance estimation.

The first and second partitions are consider to match if there is a topological match. For example, the first and second partitions have exactly the same circuit topology. Further, the input waveform coefficients for the two partitions should be within a first constant of each other. The device sizes for transistors and other devices of the two partitions should be within a second constant of another. And, the output loads for the two devices should be within a third constant of another. These constants are tolerances the user sets to tell the software how close the partitions need to be before they are considered to match.

If the first and second partitions do not match, the performance of the second partition is estimated using the approach as described above. The performance results are stored in the database, where they may be reused during subsequent executions of the software.

This detailed description of the invention has been presented for the purpose of illustration and description. It is not intended to be exhaustive or to limit the invention to the precise form described. Many modifications and variations are possible in light of this detailed description. The embodiments were chosen and described in order to best explain the principles of the invention and its practical applications. Others skilled in the art will recognize that various modifications can be made in order to best utilize and practice the invention for a particular application. The scope of the invention is defined by the following claims.

What is claimed is:

1. A method of estimating the performance of an integrated circuit design comprising:

making a first estimation of the transient performance of the integrated circuit design;

during the first estimation of the transient performance of the integrated circuit design, creating a database to store estimated transient performance results for the integrated circuit design;

making a second estimation of the transient performance of the integrated circuit design; and during the second estimation of the transient performance of the integrated circuit design, reading the database and using the stored estimated transient performance results of at least a portion of the integrated circuit design, wherein the transient performance results for the portion of the integrated circuit design were estimated during the first estimation.

2. The method of claim 1 wherein the stored estimated transient performance results comprise circuit simulation results, partitioning information, transient delays, slope information, or simulation data.

3. The method of claim 1 wherein reading the database comprises:

loading a first partition stored in the database and the stored estimated transient performance results corresponding to the first partition, determined during the first estimation of the performance of the integrated circuit design;

comparing a second partition obtained during the second estimation of the transient performance of the integrated circuit design to the first partition; and if the first and second partitions match, using the stored estimated transient performance results for the first partition as the estimated performance results for the second partition, wherein calculation of the estimated transient performance results for the second partition is avoided.

4. The method of claim 3 wherein the first partition matches the second partition if:

circuit topologies between the first and second partitions are the same;

input waveform coefficients for the first and second partitions are within a constant a of each other;

sizes of devices for the first and second partitions are within a constant b of each other; and any output load devices for the first and second partitions are within a constant c of each other.

5. The method of claim 4 wherein a, b, and c are user-defined tolerance parameters.

6. The method of claim 3 wherein a partition comprises a strongly coupled component.

7. The method of claim 3 further comprising:

if the first and second partitions do not match, calculating new estimated transient performance results for the second partition; and storing the second partition and new estimated transient performance results in the database, wherein the new estimated transient performance results may be used during a third estimation of the transient performance of the integrated circuit design.

8. The method of claim 7 wherein calculating new estimated performance results comprises:

generating vectors for the second partition;

selecting a plurality of vectors to cause a transition at an output of the second partition; and simulating the performance of the second partition using the plurality of vectors.

9. The method of claim 1 wherein the database is stored using a disk drive.

10. The method of claim 1 wherein the first estimation is performed and completed using a computer before the second estimation begins.

11. The method of claim 1 wherein making the first estimation comprises:

generating vectors for a partition of integrated circuit design;

selecting a plurality of vectors to cause a transition at an output of the second partition; and simulating the transient performance of the partition using the plurality of vectors.

12. The method of claim 1 wherein the stored estimated transient performance results comprises slope information including rate of output waveform rise or fall time.

13. The method of claim 1 wherein the first estimate of the transient performance of the integrated circuit design comprises the sum of the first estimates of the transient performance of the first and second circuit blocks.

14. The method of claim 1 wherein the second estimate of the transient performance of the integrated circuit comprises the sum of the second estimate of the transient performance of the first circuit block and the first estimate of the transient performance of second circuit block from the database.

15. A method of estimating the performance of an integrated circuit design comprising:

making a first estimation of the performance of the integrated circuit design;

during the first estimation of the performance of the integrated circuit design, creating a database to store estimated performance results for the integrated circuit design;

making a second estimation of the performance of the integrated circuit design; and during the second estimation of the performance of the integrated circuit design, reading the database and using the stored estimated performance results of at least a portion of the integrated circuit design, wherein the performance results for the portion of the integrated circuit design was estimated during the first estimation, wherein the stored estimated performance results comprises slope information including rate of output waveform rise or fall time.

16. A method of evaluating the performance of an integrated circuit design comprising:

making a first estimate of the transient performance of the integrated circuit design comprising making a first estimate of the transient performance of a first circuit block of the integrated circuit design and making a first estimate of the transient performance of a second circuit block of the integrated circuit design;

storing the first estimates of the transient performance of the first and second circuit blocks in a database; and making a second estimate of the transient performance of the integrated circuit design comprising reading the database with the stored first estimates of the transient performance of the first and second circuit blocks, making a second estimate of the transient performance of the first circuit block of the integrated circuit design, and using the first estimate of the transient performance of the second circuit block stored in the database.

17. The method of claim 16 further comprising:

after storing the first estimates of the transient performance of the first and second circuit blocks in the database, making an alteration to the second circuit block of the integrated circuit design.

18. The method of claim 16 further comprising:

during the making of the second estimate of the transient performance of the integrated circuit design, determining whether the first and second circuit blocks have been altered.

19. The method of claim 16 further comprising:

during the making of the second estimate of the transient performance of the integrated circuit design, determining that the second circuit block is substantially the same as the second circuit block during the first estimate of the transient performance of the integrated circuit.

20. A method of evaluating the performance of an integrated circuit design comprising:

making a first estimate of the performance of the integrated circuit design comprising making a first estimate of the performance of a first circuit block of the integrated circuit design and making a first estimate of the performance of a second circuit block of the integrated circuit design;

storing the first estimates of the performance of the first and second circuit blocks in a database; and making a second estimate of the performance of the integrated circuit design comprising reading the database with the stored first estimates of the performance of the first and second circuit blocks, making a second estimate of the performance of the first circuit block of the integrated circuit design, and using the first estimate of the second circuit block stored in the database;

wherein the first estimate of the performance of the integrated circuit design comprises the sum of the first estimates of the performance of the first and second circuit blocks.

21. A method of evaluating the performance of an integrated circuit design comprising:

making a first estimate of the performance of the integrated circuit design comprising making a first estimate of the performance of a first Circuit block of the integrated circuit design and making a first estimate of the performance of a second circuit block of the integrated circuit design;

storing the first estimates of the performance of the first and second circuit blocks in a database; and making a second estimate of the performance of the integrated circuit design comprising reading the database with the stored first estimates of the performance of the first and second circuit blocks, making a second estimate of the performance of the first circuit block of the integrated circuit design, and using the first estimate of the second circuit block stored in the database;

wherein the second estimate of the performance of the integrated circuit comprises the sum of the second estimate of the performance of the first circuit block and the first estimate of the second circuit block from the database.

22. A method of estimating the performance of an integrated circuit design comprising:

making a first estimation of the performance of the integrated circuit design;

during the first estimation of the performance of the integrated circuit design, creating a database to store estimated performance results for the integrated circuit design;

making a second estimation of the performance of the integrated circuit design; and during the second estimation of the performance of the integrated circuit design, reading the database and using the stored estimated performance results of at least a portion of the integrated circuit design, wherein the performance results for the portion of the integrated circuit design were estimated during the first estimation, and the reading of the database further comprises:

loading a first partition stored in the database and the stored estimated performance results for the first partition, determined during the first estimation of the performance of the integrated circuit design;

comparing a second partition obtained during the second estimation of the performance of the integrated circuit design to the first partition; and if the first and second partitions match, using the stored estimated performance results for the first partition as the estimated performance results for the second partition, wherein calculation of the estimated performance results for the second partition is avoided, wherein the first partition matches the second partition if:

circuit topologies between the first and second partitions are the same;

input waveform coefficients for the first and second partitions are within a constant a of each other;

sizes of devices for the first and second partitions are within a constant b of each other; and any output load devices for the first and second partitions are within a constant c of each other.

23. The method of claim 22 wherein a, b, and c are user-defined tolerance parameters.

24. The method of claim 22 wherein a partition comprises a strongly coupled component.

25. A method of estimating the performance of an integrated circuit design comprising:

making a first estimation of the performance of the integrated circuit design;

during the first estimation of the performance of the integrated circuit design, creating a database to store estimated performance results for the integrated circuit design;

making a second estimation of the performance of the integrated circuit design; and during the second estimation of the performance of the integrated circuit design, reading the database and using the stored estimated performance results of at least a portion of the integrated circuit design, wherein the performance results for the portion of the integrated circuit design were estimated during the first estimation, wherein making the first estimation comprises:

generating vectors for a partition of integrated circuit design;

selecting a plurality of vectors to cause a transition at an output of the second partition; and simulating the performance of the partition using the plurality of vectors.

* * * * *

UNITED STATES PATENT AND TRADEMARK OFFICE
CERTIFICATE OF CORRECTION

PATENT NO. : 6,851,095 B1  
DATED : February 1, 2005  
INVENTOR(S) : Srinivasan et al.

Page 1 of 1

It is certified that error appears in the above-identified patent and that said Letters Patent is hereby corrected as shown below:

Title page,  
Item [54], Title, should read -- METHOD OF INCREMENTAL RECHARACTERIZATION TO ESTIMATE PERFORMANCE OF INTEGRATED DESIGNS --  
Item [22], Filed, should read -- Oct. 24, 2001 --

Column 18,  
Line 65, should read -- ...partitions are within a constant $a$ of each other;... --  
Line 67, should read -- ...within a constant $b$ of each other; and ... --

Column 19,  
Line 2, should read -- ... are within a constant $c$ of each other. --  
Line 3, should read -- The method of claim 4 wherein $a$, $b$, and $c$ are ... --

Column 22,  
Line 6, should read -- ... partitions are within a constant $a$ of each other ... --  
Line 8, should read -- ... within a constant $b$ of each other; and ... --  
Line 10, should read -- ... partitions are within a constant $c$ of each other... --  
Line 11, should read -- The method of claim 22 wherein $a$, $b$, and $c$ are ... --

Signed and Sealed this

Seventeenth Day of May, 2005

JON W. DUDAS  
*Director of the United States Patent and Trademark Office*